(12) United States Patent
Kwak et al.

(10) Patent No.: US 7,476,614 B2
(45) Date of Patent: Jan. 13, 2009

(54) METHOD OF FABRICATING SEMICONDUCTOR DEVICE

(75) Inventors: Byung-Ho Kwak, Suwon-si (KR); Bum-Soo Chang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 192 days.

(21) Appl. No.: 11/491,176

(22) Filed: Jul. 24, 2006

(65) Prior Publication Data
US 2007/0032074 A1 Feb. 8, 2007

(30) Foreign Application Priority Data
Aug. 3, 2005 (KR) .................. 10-2005-0070854

(51) Int. Cl.
*H01L 21/4763* (2006.01)
(52) U.S. Cl. .................. 438/639; 438/640; 438/641; 257/E21.597
(58) Field of Classification Search .......... 438/637–645
See application file for complete search history.

(56) References Cited

U.S. PATENT DOCUMENTS

| 5,374,591 | A | | 12/1994 | Hasegawa et al. | |
|---|---|---|---|---|---|
| 5,420,076 | A | * | 5/1995 | Lee et al. | 438/637 |
| 6,103,567 | A | * | 8/2000 | Shih et al. | 438/251 |
| 6,143,645 | A | | 11/2000 | Hsu et al. | |
| 6,218,283 | B1 | * | 4/2001 | Park et al. | 438/622 |
| 6,544,886 | B2 | * | 4/2003 | Lu et al. | 438/637 |
| 6,548,349 | B2 | * | 4/2003 | Kim | 438/253 |
| 6,980,462 | B1 | * | 12/2005 | Ramesh et al. | 365/154 |

* cited by examiner

*Primary Examiner*—Phat X. Cao
*Assistant Examiner*—Nga Doan
(74) *Attorney, Agent, or Firm*—Volentine & Whitt, PLLC

(57) ABSTRACT

A method of fabricating a semiconductor device comprises sequentially forming a first conductive layer, a first insulating interlayer, a second conductive layer, and a second insulating interlayer on a semiconductor substrate. A mask layer is formed on the second insulating interlayer, and then the second insulating interlayer, the second conductive layer, and the first insulating interlayer are selectively removed using the mask layer as an etch mask to form a contact hole exposing the first conductive layer. Portions of the second conductive layer exposed in sidewalls of the contact hole are then selectively etched to form a recess between the first and second insulating interlayers. Next, a third conductive layer is formed on a bottom surface and on sidewalls of the contact hole, a metal silicide layer is formed to fill the recess, and a fourth conductive layer is formed to fill the contact hole over the metal silicide layer.

19 Claims, 8 Drawing Sheets

METHOD OF FABRICATING SEMICONDUCTOR DEVICE

BACKGROUND OF THE INVENTION

1. Field of the Invention

Embodiments of the present invention relate generally to a method of fabricating a semiconductor device. More particularly, embodiments of invention relate to a method of fabricating a semiconductor device using a metal silicide layer to form a contact pad connecting a plurality of stacked conductive layers exposed in a contact hole.

A claim of priority is made to Korean Patent Application No. 2005-0070854, filed Aug. 3, 2005, the disclosure of which is hereby incorporated by reference in its entirety.

2. Description of Related Art

As the level of integration in modern semiconductor devices increases, the size and relative spacing of components within the devices tends to decrease accordingly. For example, the channel length of transistors, the active interval, the width of interconnections, the space between interconnections, and the size of contact pads all tend to decrease as the level of integration in a semiconductor device increases.

The process of forming interconnections in a semiconductor device generally includes a step for forming a contact hole and a step for forming an interconnection in the contact hole. As the semiconductor devices become increasingly integrated, the width and horizontal extent of the interconnections tends to decrease and a vertical extent of the interconnections formed within the contact hole tends to increase. Accordingly, an aspect ratio of the interconnections within the contact hole also tends to increase.

In order to increase an operating speed of a semiconductor device and improve a reliability of interconnections formed therein, multi-layered metal interconnections are often used. To form the multi-layered interconnections, a filling technology is generally used to fill a contact hole penetrating a plurality of stacked conductive and insulating layers. A planarization process is then used to planarize an insulating interlayer on top of the stacked conductive and insulating layers. A physical vapor deposition process and/or a chemical vapor deposition process are often used for the filling technology when forming the multi-layered metal interconnections. A metal silicide layer is generally used as a contact pad to connect the multi-layered interconnections stacked in a limited area, thereby forming a low resistance contact.

The metal silicide layer functions as an ohmic layer to provide a low resistance interface between a silicon substrate and a metal layer formed thereon. The metal silicide layer also functions as a diffusion barrier layer to prevent different materials from being diffused between adjacent metal layers in a multi-layered metal system.

The metal silicide layer typically comprises titanium silicide ($TiSi_2$) or a silicide of Group VIII elements such as $PtSi_2$, $PdSi_2$, $CoSi_2$, $NiSi_2$. In a semiconductor device having a size of 0.25 μm or less, titanium silicide or cobalt silicide is generally used.

A method of fabricating a conventional semiconductor device using the metal silicide layer is described below with reference to FIGS. 1A through 1G.

Referring to FIG. 1A, in the conventional method of fabricating a semiconductor device, a first conductive layer 12 is formed with a predetermined thickness on a semiconductor substrate 10. First conductive layer 12 is often formed as an active layer of semiconductor substrate 10 by ion-implanting or diffusing conductive impurities into the surface of semiconductor substrate 10. Alternatively, first conductive layer 12 can be formed as a first gate electrode formed over an active layer formed on semiconductor substrate 10, and insulated from the active layer by a gate insulating layer. Although not shown in the drawings, an isolation layer or a spacer may be formed around first conductive layer 12 to insulate it against electrical influences from adjacent electrical components.

Referring to FIG. 1B, a first insulating interlayer 14 is formed with a predetermined thickness on first conductive layer 12. First insulating interlayer 14 functions to electrically insulate first conductive layer 12 from a subsequently formed second conductive layer 16 shown in FIG. 1C. In addition, first insulating interlayer 14 also functions to facilitate a patterning process performed on second conductive layer 16.

Referring to FIG. 1C, second conductive layer 16 is formed on first insulating interlayer 14. Second conductive layer 16, which is insulated from first conductive layer 12 by insulating interlayer 14, typically acts as an interconnection, or as a second gate electrode of a second transistor formed on first insulating interlayer 14. Second conductive layer 16 typically comprises polysilicon doped with conductive impurities. Although not shown in FIG. 1C, the second transistor typically includes a second active layer formed with a predetermined thickness at one side of the first insulating interlayer 14, a second gate insulating layer formed on the second active layer or on first insulating interlayer 14, and a second gate electrode formed on the second gate insulating layer to be connected to an upper portion of first conductive layer 12.

Referring to FIG. 1D, a second insulating interlayer 18 is formed on second conductive layer 16. Second insulating interlayer 18 is formed with a predetermined thickness to facilitate the formation of a third conductive layer to be formed on second conductive layer 16 and insulated therefrom.

Referring to FIG. 1E, a hard mask layer (not shown) is formed on second insulating interlayer 18, leaving a portion of second insulating interlayer 18 where second conductive layer 16 and first conductive layer 12 overlap exposed. Portions of second insulating interlayer 18, second conductive layer 16, and first insulating interlayer 14 are sequentially removed using the hard mask layer as an etch mask to form a contact hole 20 exposing first conductive layer 12.

Contact hole 20 penetrates second insulating interlayer 18, second conductive layer 16, and first insulating interlayer 14, and exposes a predetermined portion of first conductive layer 12. Contact hole 20 is generally formed using a dry etching method. Preferably, the dry etching method is an anisotropic etching method having excellent etch characteristics in a vertical direction. The anisotropic etching method is performed by flowing a reaction gas to etch second insulating interlayer 18, second conductive layer 16, and first insulating interlayer 14 along a direction perpendicular to semiconductor substrate 10. The anisotropic etching method permits contact hole 20 to be formed relatively well compared to a wet etching method such as an isotropic etching method.

The hard mask layer is etched by the reaction gas during the formation of contact hole 20. For example, contact hole 20 has a vertical section where an opening of second insulating interlayer 18 and an opening of second conductive layer 16 or first insulating interlayer 14 are formed to have substantially the same size. Often, contact hole 20 has an inclined surface at its sidewalls when an opening of second conductive layer 16 or first insulating interlayer 14 is formed smaller than an opening of second insulating interlayer 18.

Referring to FIG. 1F, a third conductive layer 22 comprising a material such as titanium is conformably formed on semiconductor substrate 10 and inside contact hole 20. Third conductive layer 22 reacts at an interface of the first conductive layer 12 exposed by contact hole 20 and second conductive layer 16 to form a metal silicide layer 24. Metal silicide layer 24 is formed by the reaction of the conductive metal having excellent conductivity characteristics and the polysilicon at a high temperature, and functions to decrease a resistance between second conductive layer 16 and a subsequently formed fourth conductive layer 26 (shown in FIG. 1G).

Since a deposition volume ratio of metal silicide layer 24 is significantly higher than that of third conductive layer 22, the inner sidewalls of contact hole 20 where second conductive layer 16 is exposed tend to protrude toward a center portion of contact hole 20 due to metal silicide layer 24.

Referring to FIG. 1G, a fourth conductive layer 26 filling contact hole 20 is formed on semiconductor substrate 10 over third conductive layer 22. Fourth conductive layer 26 electrically connects first conductive layer 12 and second conductive layer 16. Metal silicide layer 24 tends to decrease contact resistance between fourth conductive layer 26 and first conductive layer 12 or second conductive layer 16.

Unfortunately, a cavity 28 may form between first conductive layer 12 and metal silicide layer 24 close to where second conductive layer 16 protrudes toward the center portion of contact hole 20. Since cavity 28 is not filled with fourth conductive layer 26, the electrical characteristics of the semiconductor device are deteriorated.

SUMMARY OF THE INVENTION

A method of fabricating a semiconductor device comprises sequentially forming a first conductive layer, a first insulating interlayer, a second conductive layer, and a second insulating interlayer on a semiconductor substrate. The method further comprises forming a mask layer on the second insulating interlayer, and selectively removing the second insulating interlayer, the second conductive layer, and the first insulating interlayer using the mask layer as an etch mask to form a contact hole exposing the first conductive layer. The method still further comprises selectively etching portions of the second conductive layer exposed in sidewalls of the contact hole to form a recess between the first and second insulating interlayers, forming a third conductive layer on a bottom surface and on sidewalls of the contact hole, forming a metal silicide layer filling the recess, and forming a fourth conductive layer filling the contact hole and over the metal silicide layer.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

FIGS. 2A through 2H are sectional views illustrating a method of fabricating a semiconductor device according to an embodiment of the present invention.

Figure 1A:
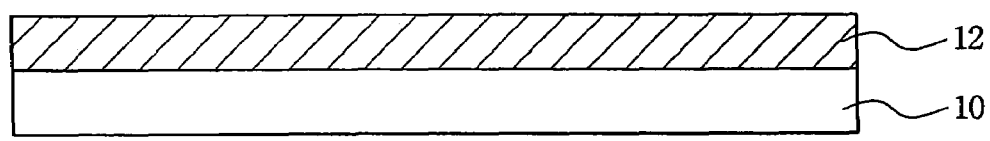
FIGS. 1A through 1G are sectional views illustrating a conventional method of fabricating a semiconductor device; and, FIGS. 2A through 2H are sectional views illustrating a method of fabricating a semiconductor device according to an embodiment of the present invention.
Figure 1B:
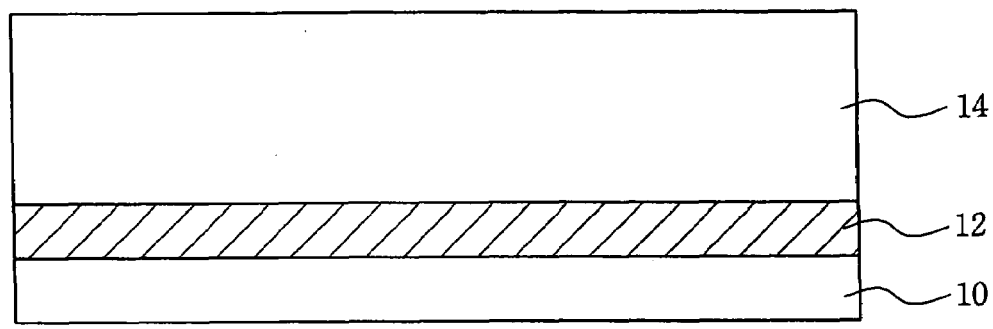
Figure 1C:
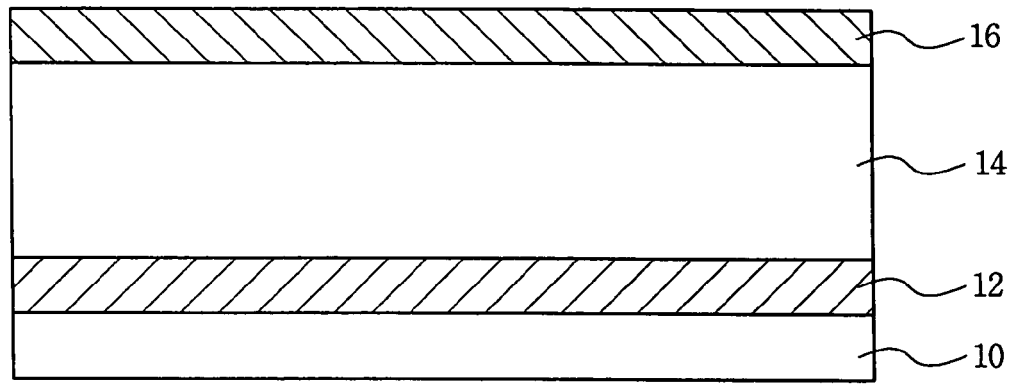
Figure 1D:
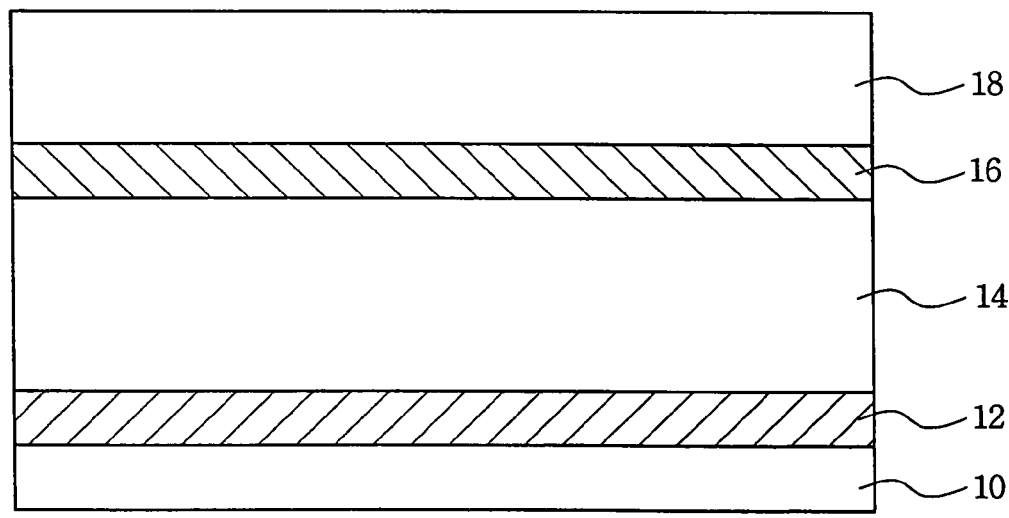
Figure 1E:
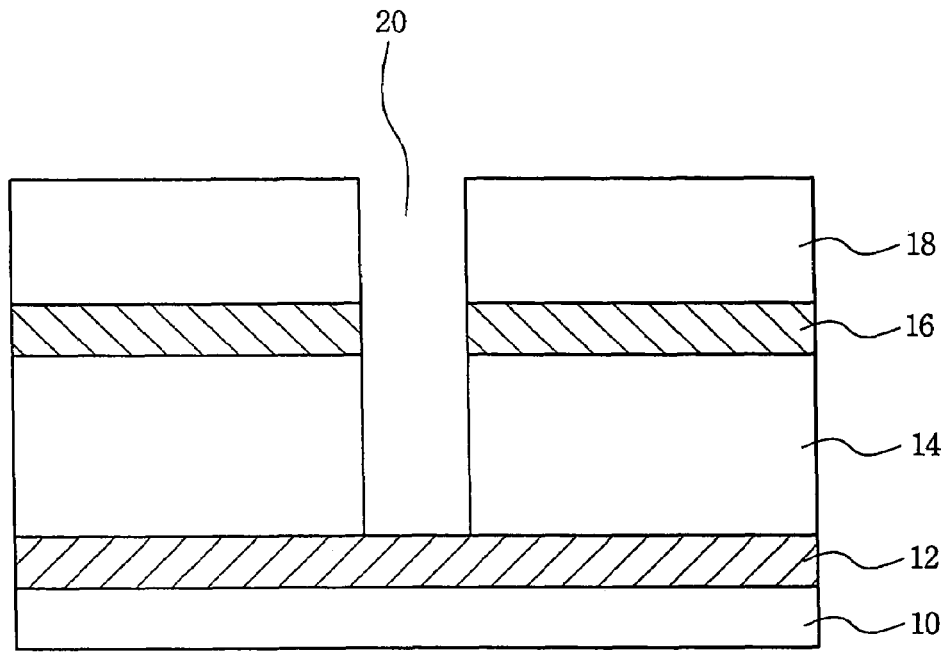
Figure 1F:
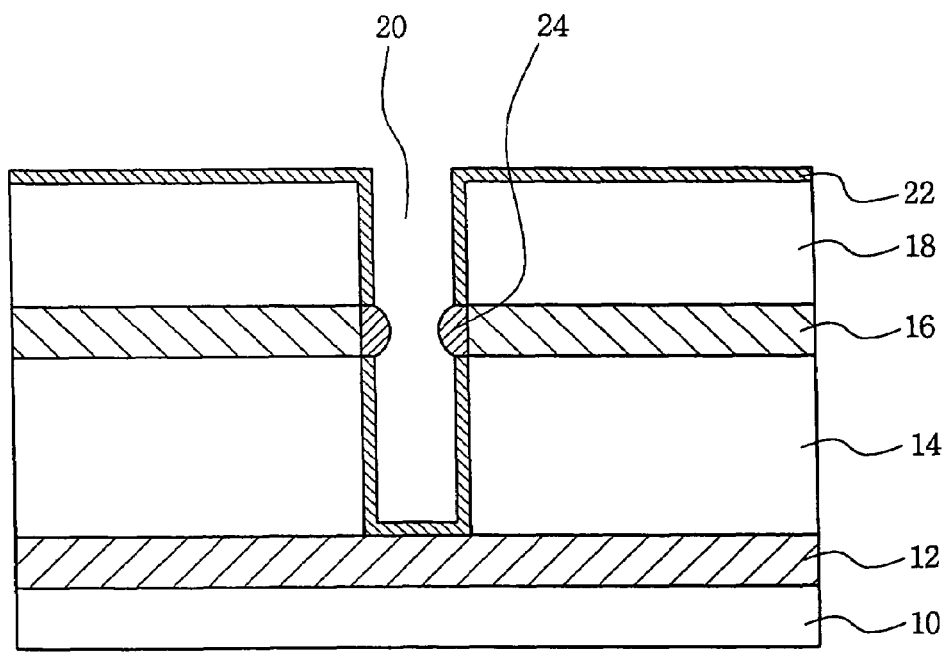
Figure 1G:
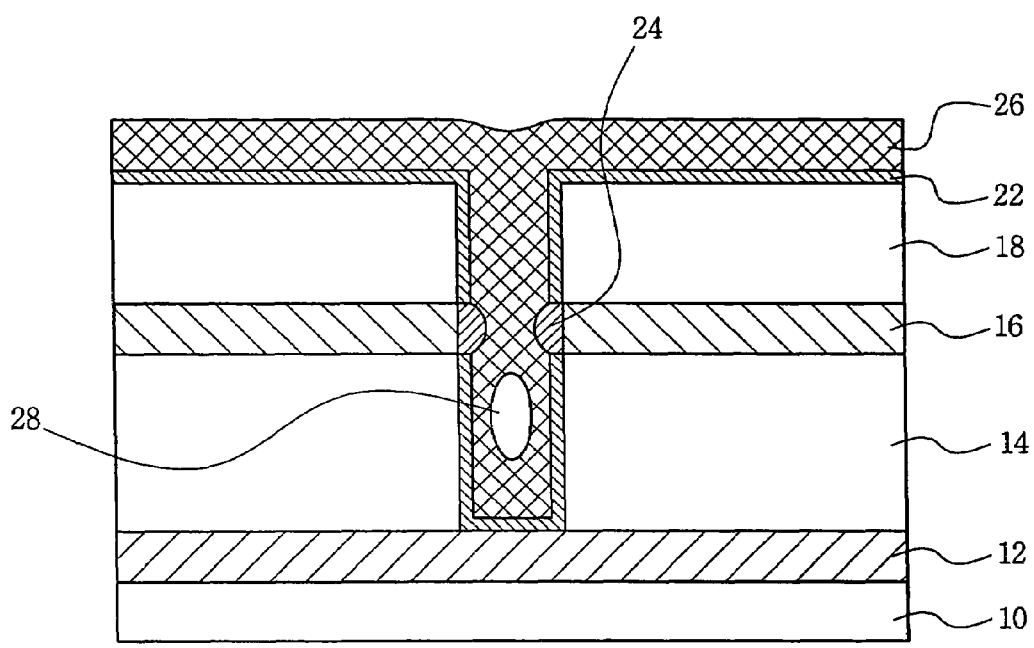
Figure 2A:
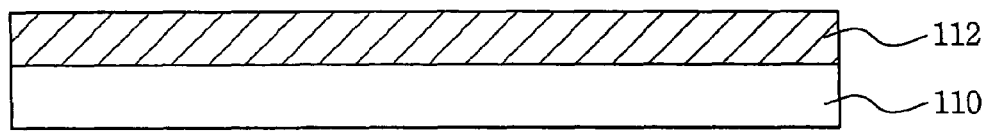

Referring to FIG. 2A, a first conductive layer 112 is formed with a predetermined thickness on a semiconductor substrate 110.

First conductive layer 112 is typically formed by implanting conductive impurities into a surface of semiconductor substrate 110 using an ion implantation or diffusion process. For example, where semiconductor substrate 110 comprises silicon, first conductive layer 112 can be formed as a first active layer on the surface of semiconductor substrate 110 by implanting acceptor or donor type of conductive impurities using an ion implantation or thermal diffusion process.

The first active layer is typically formed as a source region, a drain region, or a channel region of a first transistor. Although not shown in FIG. 2A, a first hard mask layer is formed on semiconductor substrate 110 over the first active layer to cover a region where the first transistor will be formed. Portions of semiconductor substrate 110 that are not covered by the first hard mask layer are removed using the first hard mask layer as an etch mask to form a trench. After the trench is formed, the first hard mask layer is removed.

A silicon oxide layer is formed on the entire surface of semiconductor substrate 110 to fill the trench, and then semiconductor substrate 110 is planarized to expose the first active layer. As a result, the first active layer is divided into a plurality of horizontal surface portions based on an isolation layer created by the silicon oxide layer.

Alternatively, first conductive layer 112 can be formed on top of the first active layer, over a portion where the first active layer acts as the channel region. In this case, first conductive layer 112 is typically insulated from the active layer by a first gate insulating layer and acts as a first gate electrode to form an electric field in the channel region based on an externally applied voltage having a predetermined voltage level.

The following is one example describing the formation of the first gate electrode. First, a first gate insulating layer is formed on the first active layer divided into a plurality of portions by the isolation layer using a rapid thermal process (RTP) method. The first gate insulating layer is typically formed of a silicon oxide layer. First conductive layer 112 is generally formed on the first gate insulating layer using a chemical vapor deposition (CVD) process, and first conductive layer 112 typically comprises polysilicon doped with conductive impurities.

Photoresist is deposited on first conductive layer 112, and patterned to sequentially remove portions of first conductive layer 112 and the first gate insulating layer using the photoresist as an etch mask, thereby forming a gate stack. A silicon nitride layer is formed on semiconductor substrate 110 over the gate stack, and the silicon nitride layer is isotropically etched to expose first conductive layer 112. The silicon nitride layer is generally etched using a time etch method so as to form first spacers on sidewalls of the gate stack. As a result, the first gate electrode is formed to be selectively exposed by the first spacers. A source region and a drain region of the first active layer are typically exposed on both sides of the first gate electrode. Alternatively, the source and drain may be formed by first conductive layer 112.

Figure 2B:
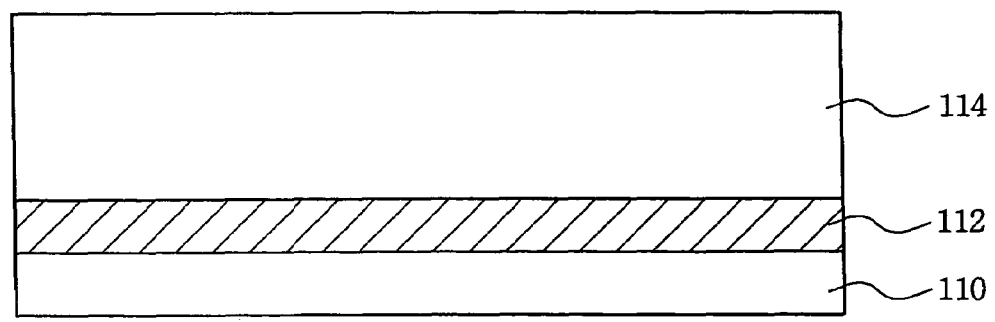
Figure 2C:
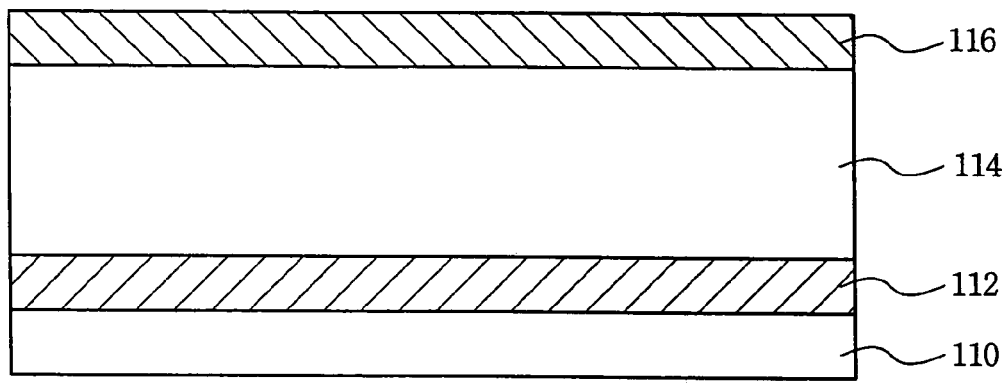
Figure 2D:
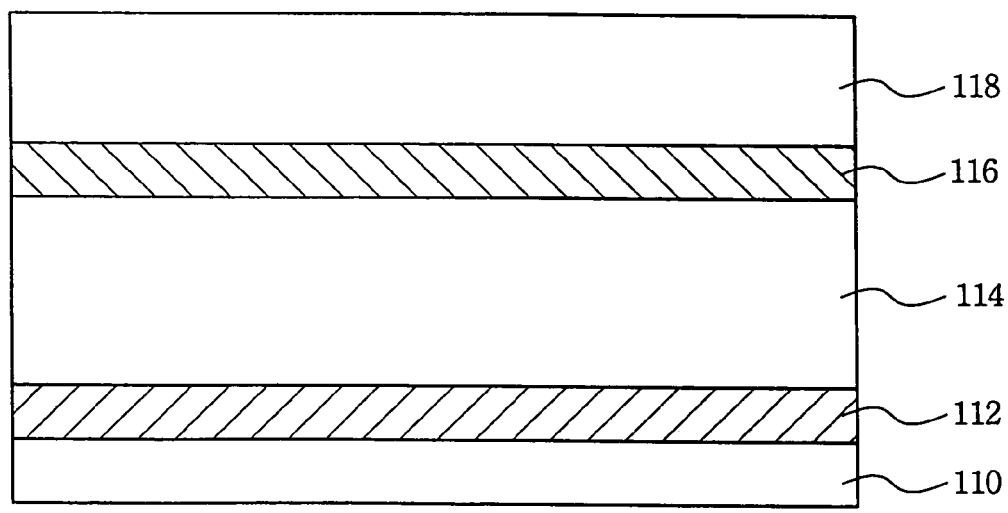
Figure 2E:
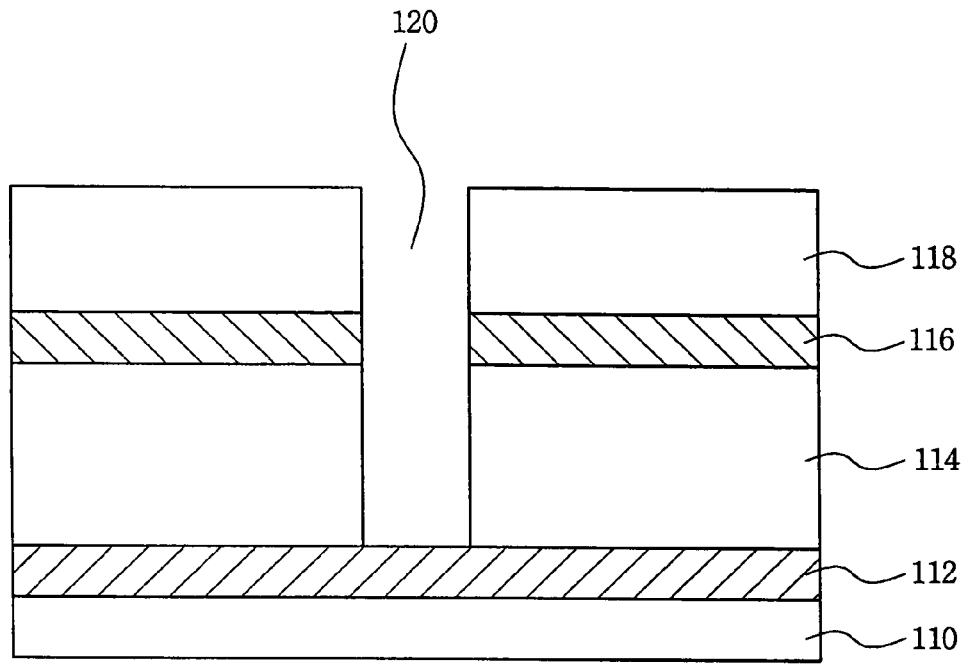

Next, an etch stop layer is formed on first conductive layer 112 to prevent over-etching of first conductive layer 112 during the formation of a contact hole 120 (shown in FIG. 2E). The etch stop layer typically comprises a silicon nitride layer or a silicon oxy-nitride layer formed by a CVD process.

Referring to FIG. 2B, a first insulating interlayer 114 is formed with a predetermined thickness on first conductive layer 112. First insulating interlayer 114 typically comprises a silicon oxide layer formed by a CVD or thermal treatment process. First insulating interlayer 114 is formed on first conductive layer 112 to electrically insulate first conductive layer 112 from a second conductive layer 116 to be formed later. First insulating interlayer 114 is planarized using a chemical mechanical polishing process to facilitate a patterning process to be performed on second conductive layer 116.

Referring to FIG. 2C, second conductive layer 116 is formed with a predetermined thickness on first insulating interlayer 114. Second conductive layer 116 generally acts as an active layer or a gate electrode for a second transistor formed on first insulating interlayer 114. Second conductive layer 116 typically comprises polysilicon doped with conductive impurities to form a metal silicide layer 124 during the subsequent formation of a third conductive layer 122 (shown in FIG. 2G) filling contact hole 120.

Although not shown in FIG. 2C, the second transistor generally includes a second active layer formed with a predetermined size on one side of first insulating interlayer 114, a second gate insulating layer formed on the second active layer or on first insulating interlayer 114, and a second gate electrode formed on the second gate insulating layer to be electrically connected to an upper portion of first conductive layer 112. Thus, a stacked structure comprising the second transistor stacked on the first transistor is formed in the semiconductor device. The stacked structure is a vertical structure capable of replacing a planar structure such as that used in conventional static random access memory (SRAM) devices.

For example, a conventional SRAM device comprises four NMOS transistors and two PMOS transistors formed in a planar structure. However, an SRAM device formed according to various embodiments of the present invention is formed to have two PMOS transistors formed over four NMOS transistors. Typically, two of the NMOS transistors are access transistors, and two of the four NMOS transistors are drive transistors. The two PMOS transistors are load transistors having load resistances, and are connected to the two NMOS drive transistors to form inverter structures by cross-coupling. In the inverter structures, gate electrodes of the NMOS drive transistors are respectively connected to corresponding gate electrodes of the PMOS transistors with first insulating interlayer 114 disposed therebetween.

Referring to FIG. 2D, a second insulating interlayer 118 is formed on semiconductor substrate 110 over second conductive layer 116. Second insulating interlayer 118 is preferably formed with a thickness sufficient to facilitate a deposition or patterning process used to subsequently form third conductive layer 122 or a fourth conductive layer 126 (shown in FIG. 2H) formed on second conductive layer 116. Second insulating interlayer 118 is formed to cover the second transistor comprising the second active layer and the second gate electrode. Preferably, second insulating interlayer 118 is formed of a silicon oxide layer using a chemical vapor deposition process or a thermal treatment process in order to improve step coverage of the second transistor.

Next, semiconductor substrate 110 having second insulating interlayer 118 is planarized using a chemical mechanical polishing process.

Referring to FIG. 2E, a second hard mask layer is formed on second insulating interlayer 118. The second hard mask layer exposes a portion of second insulating interlayer 118 where first conductive layer 112 and second conductive layer 116 overlap.

The second hard mask layer is preferably formed by forming a silicon oxide layer or a silicon nitride layer with a predetermined thickness on second insulating interlayer 118, forming photoresist on the silicon oxide layer or the silicon nitride layer, pattering the photoresist to expose a portion of second insulating interlayer 118, removing the silicon oxide layer or the silicon nitride layer using the patterned photoresist as a mask layer to expose second insulating interlayer 118, and removing the patterned photoresist. The silicon nitride layer is an opaque layer used to absorb light incident on the photoresist during an exposure process, and may function as an anti-reflective layer on the silicon oxide layer.

Second insulating interlayer 118, second conductive layer 116, and first insulating interlayer 114 are sequentially removed by performing a dry etch method using the second hard mask layer as an etch mask to form a contact hole 120 exposing first conductive layer 112. Once contact hole 120 is formed, the second hard mask layer is removed.

The dry etching method is preferably an anisotropic etching method having excellent etch characteristics. The anisotropic etching method is generally performed by flowing a reaction gas to etch second insulating interlayer 118, second conductive layer 116, and first insulating interlayer 114 along a direction perpendicular to semiconductor substrate 110. The anisotropic etching method permits contact hole 120 to be formed relatively well as compared with isotropic wet etching methods. Etching characteristics of the dry etching method can be further improved by flowing an un-reacted reaction gas along the direction perpendicular to the surface of semiconductor substrate 110 using a high temperature plasma reaction in order to prevent the reaction gas supplied to etch second insulating interlayer 118, second conductive layer 116, and first insulating interlayer 114 from flowing along the surface of semiconductor substrate 110.

The reaction gas used in the dry etching method preferably has the same or similar etch rate with respect to each of second insulating interlayer 118, second conductive layer 116, and first insulating interlayer 114. Further, the reaction gas used during the formation of contact hole 120 generally has an excellent etch selectivity between etch stop layer or first conductive layer 112 and second insulating interlayer 118, second conductive layer 116, and first insulating interlayer 114.

As one example, a reaction gas used to etch the second hard mask layer can comprise a $CF_4$ group chemical compound, a reaction gas used to etch second insulating interlayer 118 can be a $C_4F_6$ group chemical compound, a reaction gas used to etch second conductive layer 116 can be a $CF_4$ group chemical compound, a reaction gas to etch first insulating interlayer 114 can be a $C_4F_6$ group chemical compound, and a reaction gas used to remove the etch stop layer can be a $CH_3$ group chemical compound. Here, the second hard mask layer may be etched by the reaction gas along with second insulating interlayer 118, second conductive layer 116, or first insulating interlayer 114 during formation of contact hole 120.

Where the sidewalls of contact hole 120 are formed to have a vertical section by the dry etching method having an excellent etch characteristics in the vertical direction, an opening of second insulating interlayer 118, an opening of second conductive layer 116, and an opening of first insulating interlayer 114 are formed with a same or similar size. Further, where the sidewalls of contact hole 120 are formed to have an inclined surface, an opening of second insulating interlayer 118 is formed wider than an opening of second conductive layer 116, or an opening of first insulating interlayer 114.

Where first insulating interlayer 114 and second insulating interlayer 118 are composed of a same material by formed by similar processes, an opening of first insulating interlayer 114 generally cannot be formed greater than an opening of second insulating interlayer 118 by the dry etching method.

On the other hand, where contact hole 120 is formed by removing second insulating interlayer 118 and second conductive layer 116 composed of different materials using the dry etching method, second conductive layer 116 can be etched more than second insulating interlayer 118, so that an opening of second conductive layer 116 is formed greater than an opening of insulating interlayer 118.

Preferably, second conductive layer 116 is not formed with a wider opening than insulating interlayer 118 since this may cause subsequently formed third conductive layer 122 (shown in FIG. 2G) and fourth conductive layer 126 (shown in FIG. 2H) to not be connected to second conductive layer 116.

Accordingly, contact hole 120 is preferably formed such that upper layers and lower layers have vertical sections having a same size of openings, or that upper layers have inclined surfaces having openings greater than those of lower layers during the formation of contact hole 120.

In order to increase the surface resistances of first conductive layer 112 and second conductive layer 116 exposed through contact hole 120, a portion of contact hole 120 may protrude toward second conductive layer 116. Then, a metal silicide layer 124 (shown in FIG. 2G) to be formed later may be disposed at the portion of contact hole 120 protruding toward second conductive layer 116. Where metal silicide layer 124 is formed to protrude toward the center portion of contact hole 120, fourth conductive layer 126 is generally formed on metal silicide layer 124 with a cavity inside contact hole 120 since a deposition reaction gas supplied to form fourth conductive layer 126 may not flow into the bottom of contact hole 120 due to a bottleneck phenomenon of metal silicide layer 124.

Figure 2F:
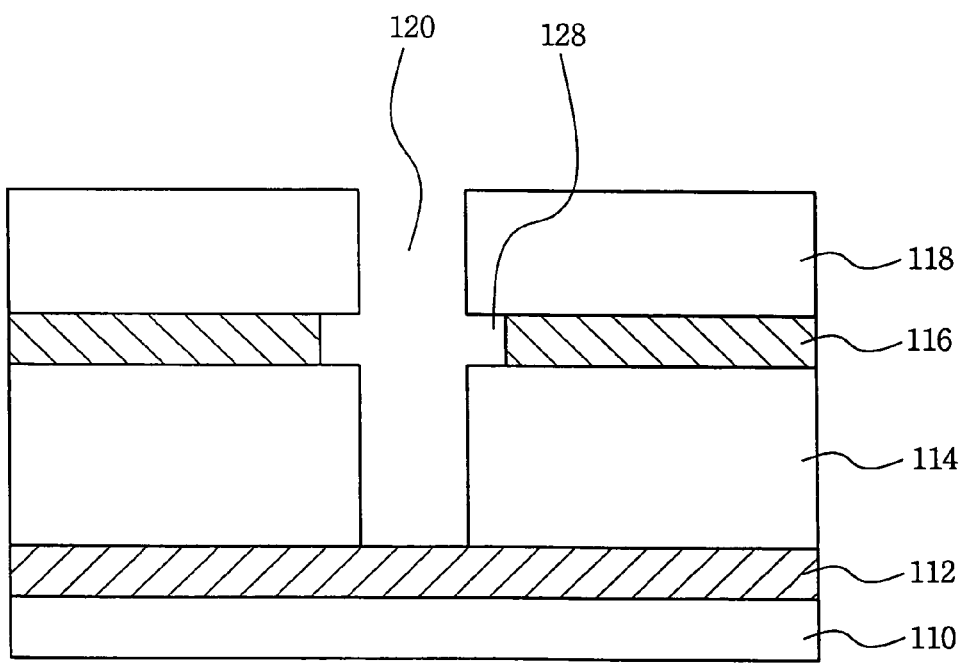

Referring to FIG. 2F, in order to prevent metal silicide layer 124 from protruding toward the center portion of contact hole 120, a portion of second conductive layer 116 exposed inside contact hole 120 is selectively removed to form a recess 128 in the sidewalls of contact hole 120. Typically, recess 128 is formed inside contact hole 120 between first insulating interlayer 114 and second insulating interlayer 118 with a depth substantially equal to the width with which metal suicide layer 124 is formed.

In one embodiment, second conductive layer 116 is etched by a wet etching method using a solution including ammonia, hydrogen peroxide, and water as an etchant, in which a volume ratio of the respective components is 4:1:95. Second conductive layer 116 comprising polysilicon can be etched at an etch rate of about 0.5 Å/sec. at a temperature of about 80° C. using the mixture solution.

The solution has an etch ratio of about 10:1 between the polysilicon and the silicon oxide layer. Accordingly, the solution can be used to etch first insulating interlayer 114 and second insulating interlayer 118 at a very low speed compared to second conductive layer 116. Where first conductive layer 112 comprises polysilicon, it is generally etched by the mixture solution at an etch rate similar to that of second conductive layer 116. For example, first conductive layer 112 and second conductive layer 116, which are exposed by contact hole 120, can be etched using the wet etching method at a same etch rate, but second conductive layer 116 interposed between first insulating interlayer 114 and second insulating interlayer 118 inside contact hole 120 can be etched at a lower etch rate than first conductive layer 112 formed along the direction perpendicular to semiconductor substrate 110, and exposed at the bottom of contact hole 120.

The wet etching method removes the polysilicon in proportion to a flow rate of the mixture solution and an area size of the polysilicon in contact with the mixture solution.

Accordingly, first conductive layer 112 is generally removed more quickly than second conductive layer 116. Thus, first conductive layer 112 is generally formed with a thickness thick such that the depth of recess 128 is much smaller than the thickness of first conductive layer 112.

For example, where second conductive layer 116 is formed with a thickness of about 800 to 1000 Å, recess 128 is generally formed with a depth of about 150 Å for about 300 seconds in second conductive layer 116 exposed by the mixture solution.

Figure 2G:
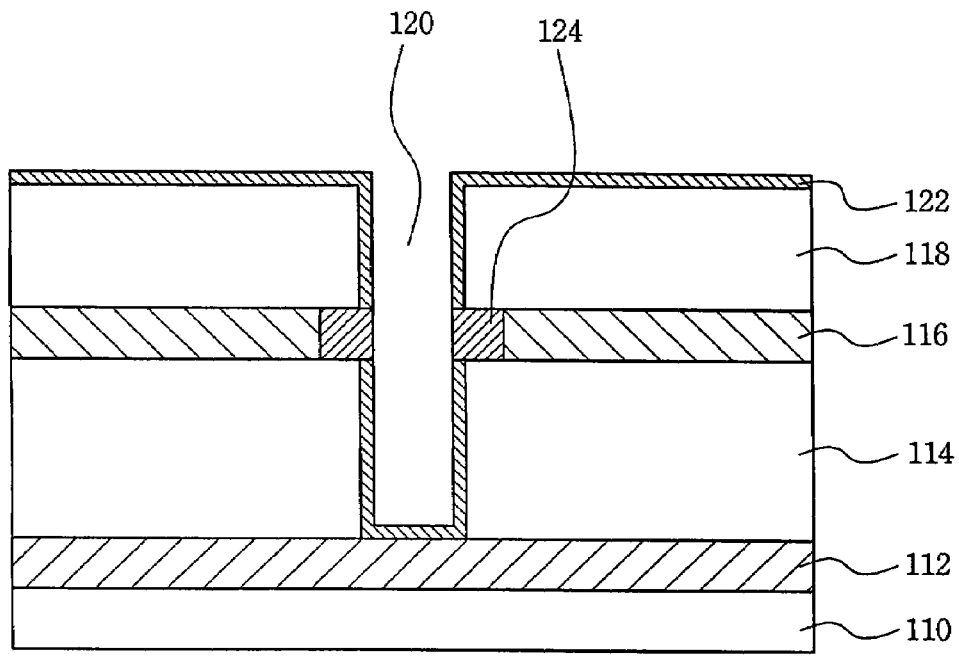

Referring to FIG. 2G, third conductive layer 122 is formed on semiconductor substrate 110 after recess 128 is formed in the sidewalls of contact hole 120. In order to improve the electrical characteristics (e.g., ohmic contact resistance) of fourth conductive layer 126 (shown in FIG. 2H) to be formed later and first or second conductive layers 112 or 116, metal silicide layer 124 is formed on the surface of second conductive layer 116.

Third conductive layer 122 typically comprises a metal such as titanium or tungsten. Thus, metal silicide layer 124 generally comprises titanium silicide, in which titanium and polysilicon are bonded at a high temperature.

The titanium silicide is preferably formed in-situ concurrently with the formation of the titanium using a CVD process, or by performing a separate thermal treatment process using a sputtering method after forming the titanium.

The titanium layer is preferably formed using a reaction gas such as titanium chloride ($TiCl_4$). Where the $TiCl_4$ reaction gas flows into recess 128, titanium is formed with a substantially uniform thickness on the entire inner surface of contact hole 120. A process chamber for forming the titanium is heated at a high temperature, and the titanium formed on first conductive layer 112 or second conductive layer 116 selectively reacts with the polysilicon to form the titanium silicide layer.

The titanium silicide has a volume about twice or more that of the reactant titanium and fills recess 128 inside contact hole 120. In general, the volume of the titanium silicide is about 2.22 times that of the reactant titanium. As an example, where the titanium silicide is formed with a thickness of about 100 Å to fill recess 128 formed with a depth of about 150 Å inside contact hole 120, the titanium is formed with a thickness of about 70 Å on the portions of first insulating interlayer 114 and second insulating interlayer 118 at the sidewalls of contact hole 120. Thus, metal silicide layer 124 is aligned with third conductive layer 122 formed on the sidewalls of contact hole 120.

In short, third conductive layer 122 is formed to go into recess 128 formed on sidewalls of contact hole 120 using a chemical vapor deposition process, and reacts with second conductive layer 116 at a high temperature to form metal silicide layer 124 inside contact hole 120 extending in the direction of second conductive layer 116.

Alternatively, in the sputtering method for forming the titanium layer, inactive gas in a plasma state is allowed to collide with a titanium target, and titanium atoms separated from the titanium target fall down on semiconductor substrate 110 through contact hole 120 and are deposited therein. Here, the titanium layer is generally formed from the bottom of contact hole 120 to the level of second conductive layer 116 or higher such that the titanium atoms separated from the titanium target by physical collision and falling down into contact hole 120 go into recess 128.

The sputtering method may be used to form a metal layer along a direction parallel to semiconductor substrate 110, but has poor step coverage characteristics compared to the CVD process when filling contact hole 120. Thus, the titanium layer formed by the sputtering method is generally formed to fill recess 128 when first insulating interlayer 114 formed between first conductive layer 112 and second conductive layer 116 is less than a predetermined thickness.

A titanium silicide layer is formed by allowing the titanium layer filling recess 128 to react with the polysilicon at a high temperature. The titanium silicide layer improves electrical characteristics such as ohmic contact characteristics between second conductive layer 116 and the titanium layer. Since the titanium layer normally has a high electric resistance, it can be replaced with a tungsten layer. For example, a tungsten target can be used in the sputtering method to form the tungsten layer.

Third conductive layer 122 is formed to fill recess 128 using the CVD process rather than the sputtering method to limit to the required thickness of insulating interlayer 114, and third conductive layer 122. Second conductive layer 116 comprising a polysilicon material are allowed to react with each other to form metal silicide layer 124, thereby preventing metal silicide layer 124 from protruding from the sidewalls of contact hole 120.

Figure 2H:
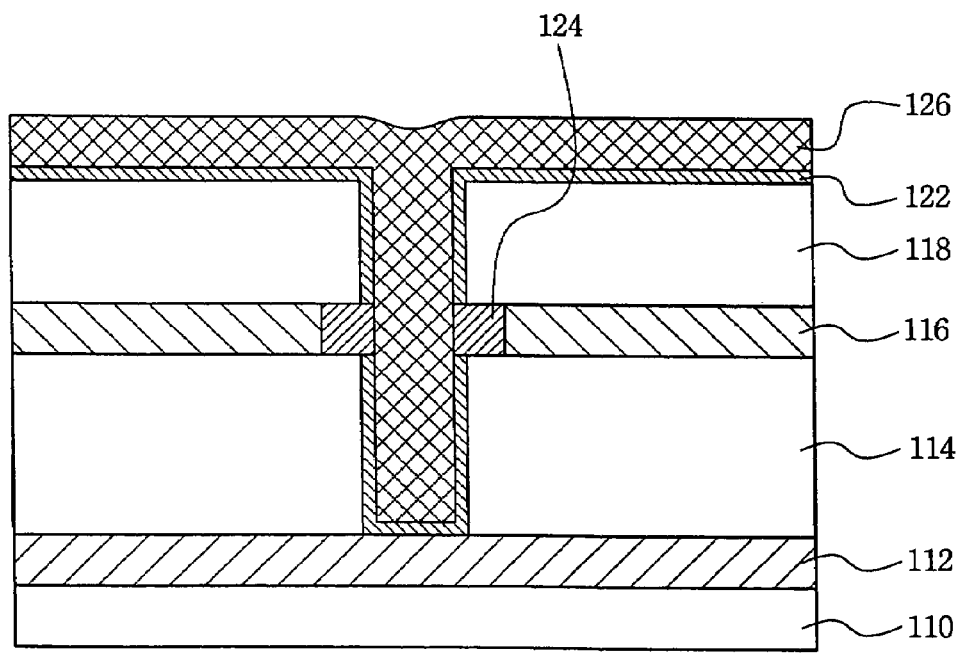

Referring to FIG. 2H, fourth conductive layer 126 is formed on semiconductor substrate 110 to fill contact hole 120. Fourth conductive layer 126 electrically connects first conductive layer 112 and second conductive layer 116. Metal silicide layer 124 formed at an electrical interface between first conductive layer 112 and second conductive layer 116 and improves electrical characteristics such as ohmic contact characteristics between first conductive layer 112 and fourth conductive layer 126.

Fourth conductive layer 126 generally includes interconnections formed on second insulating interlayer 118, or a third active layer or third gate electrode of a third transistor. Fourth conductive layer 126 typically comprises tungsten or aluminum and is formed using a CVD process.

Fourth conductive layer 126 formed using the CVD process can fill contact hole 120 without generating a cavity inside contact hole 120 between the bottom of contact hole 120 and metal silicide layer 124 since metal silicide layer 124 does not protruded from sidewalls of contact hole 120. For example, the chemical vapor deposition process is performed such that a reaction gas for forming the fourth conductive layer 126 is circulatingly supplied into contact hole 120. While the reaction gas flows into the bottom or inner sidewalls of contact hole 120, precipitate is generated to form fourth conductive layer 126.

Since metal silicide layer 124 does not protrude toward the center of contact hole 120, the reaction gas can flow into the bottom of contact hole 120 while running along the inner sidewalls of contact hole 120. Fourth conductive layer 126 is gradually formed from the bottom or the inner sidewalls of contact hole 120 with a same or similar thickness by the reaction gas to fill contact hole 120.

In a SRAM device, a plurality of PMOS transistors used as load transistors are electrically connected to a plurality of NMOS transistors used as drive transistors by cross-coupling through fourth conductive layer 126 filling contact hole 120 or metal silicide layer 124.

Accordingly, in the method of fabricating a semiconductor device according to selected embodiments of the present invention, recess 128 is formed by selectively etching second conductive layer 116 exposed on the sidewalls of contact hole 120, and metal silicide layer 124 is formed to fill recess 128. Metal silicide layer 124 is prevented from protruding toward the center portion of contact hole 120 to avoid generating a cavity in fourth conductive layer 126 between first conductive layer 112 and second conductive layer 116 when burying contact hole 120 using fourth conductive layer 126. By preventing the formation of the cavity, deterioration of electrical characteristics in the device can be prevented, and a production yield can be increased or maximized.

The invention has been described above in relation to several exemplary embodiments shown in the drawings. However, those skilled in the art will recognize that various changes in the details of these embodiments can be made without departing from the scope of the invention. For example, another conductive layer may be formed in addition to first conductive layer 112 or second conductive layer 116 exposed inside contact hole 120. Further, another conductive layer may be used to fill contact hole 120 in addition to third conductive layer 122 or fourth conductive layer 126.

As described above, the second conductive layer exposed on the sidewalls of the contact hole can be selectively etched to form a recess, and the metal silicide layer is formed with a predetermined depth to fill the recess. Since the metal silicide layer does not protrude from the sidewalls of the contact hole toward the center portion thereof, the fourth conductive layer can be formed to bury the contact hole without a cavity, and thus, the deterioration of electrical characteristics in the semiconductor device are prevented, thereby increasing or maximizing a production yield.

What is claimed:

1. A method of fabricating a semiconductor device, the method comprising:
   forming a first conductive layer on a semiconductor substrate;
   forming a first insulating interlayer on the first conductive layer;
   forming a second conductive layer on the first insulating interlayer;
   forming a second insulating interlayer on the second conductive layer;
   forming a mask layer on the second insulating interlayer;
   selectively removing the second insulating interlayer, the second conductive layer, and the first insulating interlayer using the mask layer as an etch mask to form a contact hole exposing the first conductive layer;
   selectively etching portions of the second conductive layer exposed in sidewalls of the contact hole to form a recess between the first and second insulating interlayers;
   forming a third conductive layer on a bottom surface and on sidewalls of the contact hole;
   forming a metal silicide layer filling the recess; and,
   forming a fourth conductive layer filling the contact hole and over the metal silicide layer.

2. The method of claim 1, wherein the recess is formed by removing the portions of the second conductive layer exposed in the sidewalls of the contact hole using a wet etching process.

3. The method of claim 2, wherein the second conductive layer is removed using a solution comprising ammonia, hydrogen peroxide, and water mixed with a volume ratio of 4:1:95.

4. The method of claim 3, wherein when the second conductive layer comprises polysilicon and the polysilicon is removed using the solution at a temperature of 80° C. and at an etch rate of about 0.5 Å/sec.

5. The method of claim 3, wherein the mixture solution has an etch ratio of 10:1 between polysilicon and a silicon oxide layer.

6. The method of claim 2, wherein when the second conductive layer has a thickness of about 800 to 1000 Å, the recess has a depth of about 150 Å.

7. The method of claim 1, wherein the third conductive layer comprises a titanium layer formed using a chemical vapor deposition process.

8. The method of claim 7, wherein the metal silicide layer is formed on an exposed surface of the second conductive layer at a high temperature concurrently with the formation of the third conductive layer.

9. The method of claim 7, wherein the titanium layer is formed using a reaction gas comprising titanium chloride.

10. The method of claim 1, wherein the metal silicide layer has a volume about 2.2 times that of a reactant metal used to form the metal silicide layer.

11. The method of claim 1, wherein the third conductive layer comprises a titanium layer and is formed using a sputtering method.

12. The method of claim 11, wherein the titanium layer is formed from the bottom of the contact hole to a level of the sidewalls of the contact hole where the recess is formed or higher.

13. The method of claim 1, wherein the fourth conductive layer comprises a tungsten layer or an aluminum layer formed using a chemical vapor deposition process.

14. The method of claim 1, wherein the contact hole is formed by performing an anisotropic dry etching method.

15. The method of claim 1, wherein the first conductive layer acts as an active layer of a first transistor and the second conductive layer acts as an active layer of a second transistor.

16. The method of claim 1, wherein the first conductive layer acts as a gate electrode of a first transistor and the second conductive layer acts as a gate electrode of a second transistor.

17. The method of claim 1, wherein a reaction gas comprising a $C_4F_6$ group chemical compound is used to etch the second insulating interlayer, a reaction gas comprising a $CF_4$ group chemical compound is used to etch the second conductive layer, or a reaction gas comprising a $C_4F_6$ group chemical compound is used to etch the first insulating interlayer.

18. The method of claim 1, wherein the first conductive layer is formed with a first thickness and the second conductive layer is formed with a second thickness less than the first thickness.

19. A method of fabricating a semiconductive device, the method comprising:

forming a first conductive layer on a semiconductor substrate;

forming a first insulating interlayer on the first conductive layer;

forming a second conductive layer on the first insulating interlayer;

forming a second insulating interlayer on the second conductive layer;

forming a mask layer on the second insulating interlayer;

selectively removing the second insulating interlayer, the second conductive layer, and the first insulating interlayer using the mask layer as an etch mask to form a contact hole exposing the first conductive layer;

selectively etching portions of the second conductive layer exposed in sidewalls of the contact hole to form a recess between the first and second insulating interlayers;

after formation of the recess, forming a third conductive layer on bottom and sidewalls surfaces of the contact hole, such that formation of the third conductive layer forms a metal silicide layer filling the recess to reduce the ohmic contact resistance between the second conductive layer and a fourth conductive layer filling the contact hole over the third conductive layer and metal silicide layer.

* * * * *